United States Patent

Hoffman et al.

[11] 4,037,243
[45] July 19, 1977

[54] SEMICONDUCTOR MEMORY CELL UTILIZING SENSING OF VARIATIONS IN PN JUNCTION REVERSE CURRENT CONTROLLED BY STORED DATA

[75] Inventors: Charles R. Hoffman, Tempe; Michael W. Powell, Mesa, both of Ariz.

[73] Assignee: Motorola, Inc., Schaumburg, Ill.

[21] Appl. No.: 716,394

[22] Filed: Aug. 23, 1976

Related U.S. Application Data

[63] Continuation of Ser. No. 484,487, July 1, 1974, abandoned.

[51] Int. Cl.$^2$ .................. H01L 29/78; H01L 27/02; H01L 29/34
[52] U.S. Cl. ..................................... 357/23; 357/42; 357/43; 357/54; 307/304; 340/173 R
[58] Field of Search .............. 357/23, 24, 42, 52, 357/54, 34, 43; 307/304; 340/173

[56] References Cited

U.S. PATENT DOCUMENTS

| | | |
|---|---|---|
| 3,397,326 | 8/1968 | Gallagher et al. ................. 357/43 |
| 3,418,493 | 12/1968 | Uzunoglu et al. ................. 357/34 |
| 3,653,002 | 3/1972 | Goffee ................. 357/23 |
| 3,816,769 | 6/1974 | Crowle ................. 307/304 |
| 3,846,766 | 11/1974 | Nojima et al. ................. 357/54 |
| 3,877,058 | 4/1975 | Cricchi ................. 357/23 |
| 3,881,180 | 4/1975 | Gosney ................. 357/23 |

*Primary Examiner*—Andrew J. James
*Attorney, Agent, or Firm*—Charles R. Hoffman

[57] ABSTRACT

Charge is stored on the gate of a gate controlled diode in a memory element to provide a junction breakdown memory cell. A quantity of charge representative of a logical 1 or a logical 0 may be dynamically stored in one embodiment. In another embodiment a composite silicon nitride/silicon dioxide dielectric is utilized to provide non-volatile storage of a logic state. Selection and sensing circuitry are coupled to an array of junction breakdown memory elements. Sensing circuitry detects the difference in reverse current of the gate controlled diode corresponding to a stored logical 1 and a stored logical 0, respectively.

7 Claims, 8 Drawing Figures

SEMI-CONDUCTOR MEMORY CELL UTILIZING SENSING OF VARIATIONS IN PN JUNCTION REVERSE CURRENT CONTROLLED BY STORED ALATA

This is a continuation of application Ser. No. 484,487, filed July 1, 1974, now abandoned.

BACKGROUND OF THE INVENTION

A variety of semiconductor memory elements have been utilized to provide integrated circuit random access memories and read only memories. Dynamic memory cells and static memory cells have been utilized. Most of the semiconductor memory elements, however, have been volatile. That is, stored data is lost when a power shutdown or power failure occurs. MNOS transistors have been utilized to construct non-volatile memory elements. The operation of such non-volatile memory elements, however, has been such that relatively tight tolerances are required on one or both of the high and low threshold voltages which can be written into the composite dielectric structure of an MNOS transistor corresponding to a logical 1 or a logical 0. MNOS processing required to achieve the necessary tolerances is at the present time inadequate to provide the required tolerance at an economical cost and yet maintain acceptable reliability.

SUMMARY OF THE INVENTION

It is an object of this invention to provide an improved semiconductor element.

It is a further object of the invention to provide an improved junction breakdown memory cell.

It is a further object of the invention to provide a non-volatile junction breakdown memory cell.

It is another object of the invention to provide a junction breakdown memory cell capable of being manufactured with improved component density and requiring favorable manufacturing process tolerances.

Briefly described, the invention is a semiconductor memory cell including a PN junction whose reverse current is controlled by charge stored on a gate electrode on a dielectric over said semiconductor junction.

DESCRIPTION OF THE INVENTION

Figure 1:
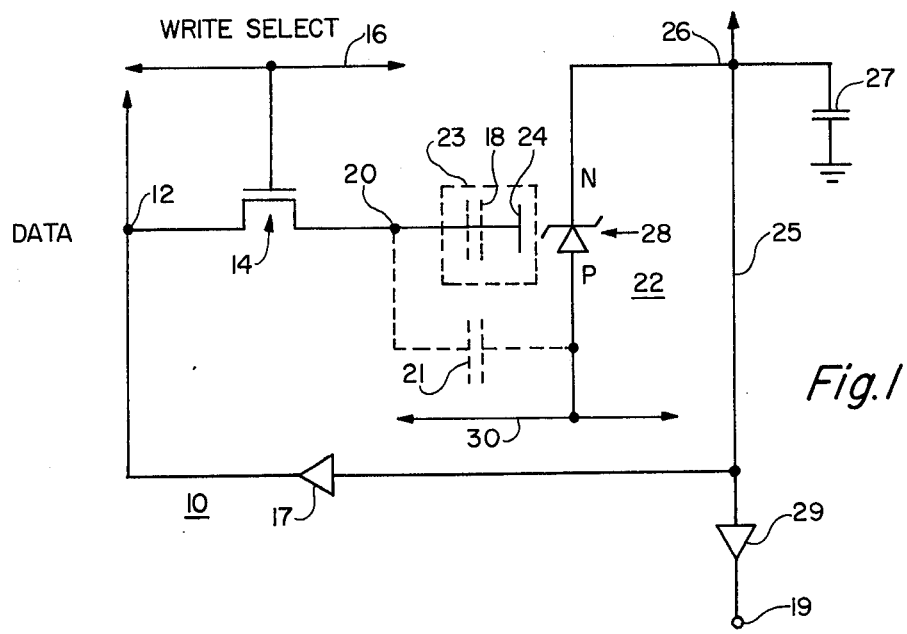
FIG. 1 is a schematic diagram of an embodiment of the invention.

In FIG. 1, junction breakdown memory cell 10 includes write-select MOSFET 14 and gate controlled diode 22. MOSFET 14 is coupled between data input conductor 12 and storage node 20 and has its gate electrode coupled to write-select conductor 16. Gate controlled diode 22 has an N-type electrode coupled to sense line 26 and a P-type electrode coupled to read-select conductor 30, and has its gate electrode 24 coupled to storage node 20. Sense conductor 26 has a parasitic capacitance 27 associated therewith and may be connected to a sense amplifier 29 having an output 19. Sense conductor 26 may also be connected to a feedback refresh amplifier 17 which may refresh data stored at node 20 through MOSFET 14.

Storage node 20 has associated therewith a capacitance 21 between the P-type electrode of gate controlled diode 22 and storage node 20.

In another embodiment of the invention, a composite dielectric may be used for gate controlled diode 22 rather than the usual silicon dioxide dielectric. The composite dielectric, described hereinafter, may be a silicon dioxide/silicon nitride dielectric. This alternative embodiment is schematically represented in FIG. 1 by composite dielectric 23 which has an equivalent circuit representable by capacitor 18 and which symbolizes the capacitance between the gate conductor and the interface between the two types of insulator material forming the composite dielectric, such as silicon nitride and silicon dioxide. The dotted lines representing capacitor 18 indicate that it is an alternative embodiment.

Figure 2:
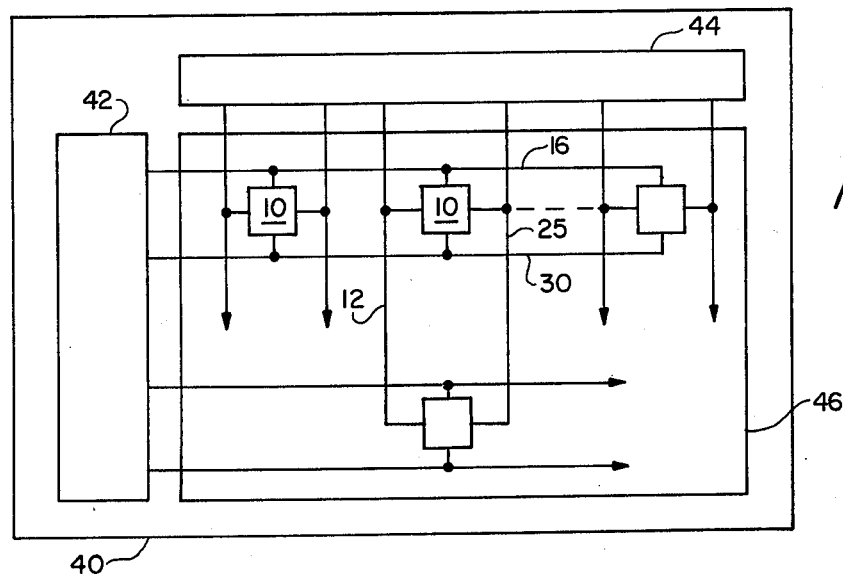
FIG. 2 is a schematic block diagram of a semiconductor memory chip utilizing a memory device of the types shown in FIGS. 1, 6 and 7.

FIG. 2 illustrates the manner in which a storage cell such as the dynamic junction breakdown memory cell of FIG. 1 may be interconnected in an integrated chip 40 to provide a memory array. Chip 40 includes array 46 which is an array of junction breakdown memory cells which are designated by reference numeral 10 since they may be the same as those described with reference to FIG. 1. Memory cell array 46 includes an integral number of columns and an integral number of rows of memory cells 10 in which each row of cells shares a common read-select line 30 and a common write-select line 16 and each column of cells shares a common data conductor 12 and a common sense conductor 26. The array is coupled to row selection circuitry 42 and column selection and refresh and input-/output circuitry 44.

Figure 3:
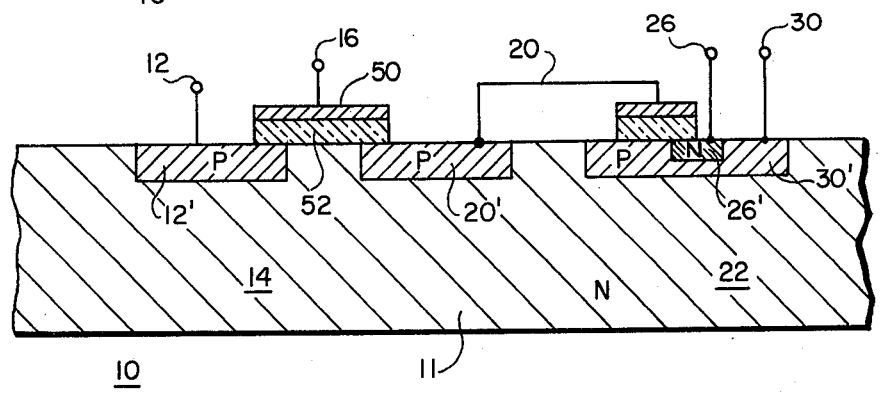
FIG. 3 is a cross sectional diagram representing a particular implementation of the embodiment shown in FIG. 1.

FIG. 3 is a cross sectional drawing of an implementation on a semiconductor die of the dynamic junction breakdown memory cell of FIG. 1. In FIG. 3, junction breakdown memory cell 10 is fabricated on N-type wafer 11. MOSFET 14 includes P-type source and drain regions 12' and 20', at the upper surface of the wafer 11, connected, respectively, to data conductor 12 and storage node conductor 20. Gate insulator 52 is provided on the upper surface of wafer 11 and gate conductor 50 is formed on dielectric 52 and is connected to write-select conductor 16.

Gate control diode 22 is also fabricated at the upper surface of wafer 11 and includes P-type region 30' connected to read-select conductor 30 and N-type region 26' formed within P-type region 30' at said upper surface and connected to sense conductor 26. Gate insulator 37 is formed across the PN junction between regions 26' and 30' and has gate conductor 39 formed thereon, gate connector 39 being connected to storage node 20. Gate insulator 37 may, in an embodiment later explained, be a composite dielectric such as an MNOS dielectric;

In which case the lower section would be silicon dioxide and the upper section would be silicon nitride. Typically gate insulator 52 is silicon dioxide. Gate conductors 50 and 39 may be metal or polycrystalline silicon or other suitable material.

Figure 4:
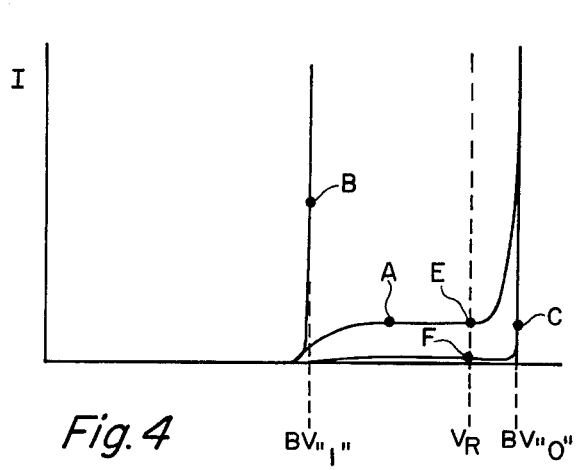
FIG. 4 is a graph useful in describing the modes of operation of the gate controlled diode in the memory elements of FIGS. 1, 6 and 7.

FIG. 4 graphically describes the performance of a gate-controlled diode as it relates to the operation of the invention. If the voltage on the gate electrode of a gate controlled diode is approximately zero volts, the breakdown voltage is substantially higher compared to when a high magnitude negative voltage is applied thereto. Assume for the following discussion that zero volts applied to the gate conductor represents a logical 0 and a large magnitude voltage represents a logical 1. For one type of gate controlled diode, which may be referred to as operating in the induced junction mode, curve F indicates the reverse voltage breakdown characteristic for the case of a stored logical 0 and curve A represents the characteristic for a stored logical 1. For a gate controlled diode operating in a non-induced junction mode, curve B represents a stored 1 with a larger magnitude stored voltage. The lower breakdown voltage and upper breakdown voltage represented in FIG. 4 are designated, respectively, by $BV_1$ and $BV_0$. As is explained subsequently, for the induced junction mode of operation, it is convenient to apply a read voltage $V_R$ to the read-select conductor which is relatively close in magnitude to $BV_0$, causing an operating point at E in a case of a stored 0 and causing operating point F for a stored 1.

Figure 6:
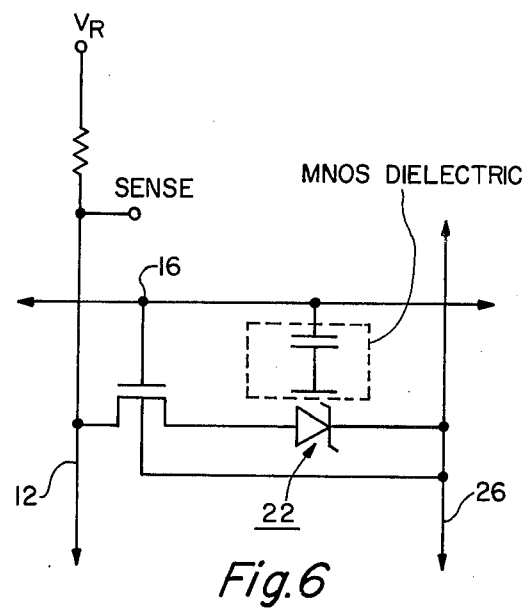
FIG. 6 is a schematic diagram of another embodiment of the invention.

FIG. 6 depicts an alternative embodiment of the invention in which coupling MOSFET 72 is connected between the P-type electrode 73 of gate controlled diode 22 and data conductor 12. The gate of MOSFET 72, which in a preferred embodiment is an MNOS device, is connected to write/read conductor 16, which is also connected to the composite MNOS dielectric gate conductor 74 of gate controlled diode 22. The arrows on the conductors 12, 16 and 26 in FIG. 6 merely indicate that the conductors are extended and shared with other cells to form an array. The N-type electrode 75 of gate controlled rectifier 22 is connected to conductor 26. Data conductor 12 may, in one embodiment, be connected to a resistive element 71, which is used to ratio with the dynamic impedance of circuit 10 to establish the 1 level, in which case conductor 12 operates as a sense conductor and resistive element 71 is connected between data conductor 12 and read voltage conductor $V_R$. The operation of writing and also of row selection is performed by signals applied to conductor 16. Conductor 26 may be connected to ground, which may be the substrate. Other embodiments are feasible, wherein conductor 12 operates as a sense conductor and is coupled to a sensing element or amplifier of some sort. Note that MOSFET 72 prevents current conduction in other junction breakdown memory cells coupled to data conductor 12.

Figure 7A:
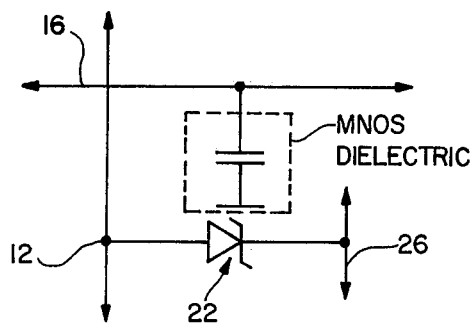
FIG. 7a is a schematic diagram of a further embodiment of the invention.

FIG. 7a illustrates a simplified version of the memory element of FIG. 6 wherein coupling MOSFET 72 has been eliminated. The operation of the memory element of FIG. 7a is explained hereinafter.

Figure 7B:
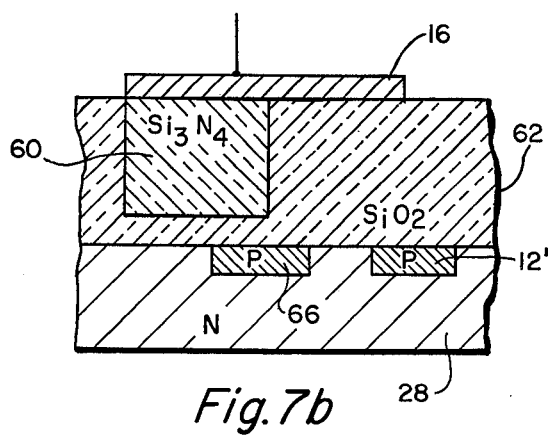
FIG. 7b is a cross sectional diagram of a gate controlled diode with an MNOS dielectric.

FIG. 7b is a cross sectional diagram of a semiconductor wafer in which the memory element of FIG. 6 is formed. FIG. 7b includes an N-type body into which P-type region 66 is formed. A thin layer of $SiO_2$ 63 is sandwiched between the upper surface of N-type body 68 and silicon nitride layer 60 to form a composite dielectric layer 62 over part of PN junction 65 which terminates at the upper surface of body 68. Gate electrode 16 is formed on the upper surface of composite dielectric 62.

Further information on gate controlled diode phenomena can be found in *Physics and Technology of Semiconductor Devices* by A. S. Groove, John Wiley and Sons, Inc., New York, 1967. Further reading on composite dielectrics can be found in "Charge Transport and Storage in Metal-Nitride-Oxide-Silicon (MNOS) Structure", *Journal of Applied Physics*, Vol. 40, No. 8, July, 1969, pages 3307–3319. Also see "Switching and Storage Characteristics of MIS Memory Transistors", *RCA Review*, Vol. 30, June, 1969, pages 335–365.

Figure 5:
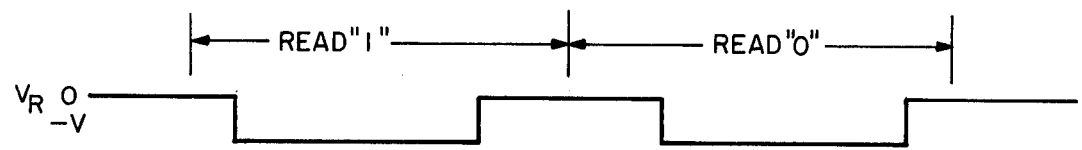
FIG. 5 is a timing diagram useful in explaining the operation of the embodiment of FIG. 1 for read cycles in which a logical 0 and a logical 1, respectively, are stored.

The operation of the junction breakdown memory cell of FIG. 1 may be explained best with reference to the timing diagram of FIG. 5 and the voltage characteristic of FIG. 4. The operation is essentially as follows. Assuming that MOSFET 14 is P channel, a zero voltage may be written into and stored on storage node 20 by applying a negative voltage to write-select line 16 and a zero voltage to data conductor 12, thereby charging node 20 and turning off MOSFET 14, nodes 26 and 30 both being maintained at ground.

The negative voltage applied to node 16 may be slightly less than the breakdown voltage of gate controlled diode 22, which ends up with the stored negative voltage applied to its gate electrode 24. If junction breakdown storage cell 10 is then subjected to a read operation, which is initiated by bringing read-select conductor 30 to $-V$ volts, only the low leakage current indicated in FIG. 4 by reference letter F will flow between terminals 26 and 30, and no detectable voltage change will occur at node 26. With reference to FIG. 5, $V_R$ is the voltage applied to read-select conductor 30, and $V_{SENSE}$ is the voltage change at node 26. The above operation refers to the read 1 cycle indicated in FIG. 5.

The following description refers to the read 1 cycle in FIG. 5. Before considering the read 0 operation, the operation of writing a logical 1 into storage node 20 is described. This is accomplished by applying $-V$ volts to data conductor 12, and applying a negative write-select voltage to line 16, thereby turning MOSFET 14 on, lines 26 and 30 both being at ground voltage, as explained above, and accessing junction breakdown memory cell 10 by applying $-V$ volts, as indicated in FIG. 5, by waveform $V_R$ at node 30. The PN junction of gate controlled diode 22 is constrained to its reverse breakdown mode as indicated in FIG. 4 by curve A or curve B. For the induced junction case, the current indicated at point E of FIG. 4 will initially flow through terminals 26 and 30 of memory cell 10 thereby causing a change in voltage on line 26 represented by the $V_{SENSE}$ waveform of FIG. 5, which voltage change is detected by sense amplifier 29. If sense conductor 26 is loaded only by capacitance 27, a linear ramp function will describe the discharge of sense conductor 26 from ground to $-(V_R - BV_1)$ volts.

Referring to FIG. 6, gate conductor dielectric 74 may be an alterable threshold device with a 20–50 Angstrom silicon dioxide layer under an approximately 700 Angstrom thick silicon nitride layer. MOSFET 72 may be an MOS or a MNOS device (200 Angstroms of silicon dioxide beneath 700 Angstroms of silicon nitride for MNOS). MOSFET 72 will have the fixed threshold voltage. Write-select conductor 16 can be manipulated to select both the gate diode and fixed threshold devices 22 and 72. When an erase voltage is applied to line 16 in the form of a large positive voltage with respect to a substrate ground potential, the gate diode silicon nitride interface surface is filled with negative charge in a manner described in the above referenced literature. This negative interface charge causes gate controlled diode 22 to operate in an induced junction mode after the erase voltage on line 16 returns to ground potential. Later, when line 16 is selected with an address-read voltage applied thereto, gate controlled diode 22 will exhibit field induced junction breakdown of its channel and a saturation current (point E in FIG. 4) will flow as indicated in FIG. 4. The field induced junction breakdown voltage $BV_1$ is less than magnitude and the metalurgalical junction breakdown voltage $BV_O$. Data sensing resistor 71 has a sense voltage induced across it by the saturation current flowing through MOSFET 72 and gate controlled diode 22. It should be noted that for more negative charge stored gate controlled diode 22 provides more saturation current.

To write the opposite state into the MNOS dielectric 74, a negative voltage with respect to the substrate ground potential is applied to conductor 16, and the silicon dioxide/silicon nitride interface fills with positive charge after the write operation is complete and line 16 returns to ground. During a read operation, when a read voltage is applied to conductor 16, gate controlled diode 22 will not break down (note $BV_O > V_R$) because no channel exists and therefore only the current indicated at point F in FIG. 4 will flow, and no output voltage will be developed across resistor 71.

In the embodiment of FIG. 7a, each of the memory cells shares a common sense line 12, which may be a P-type diffused line, and each row of cells shares a common line connected to all of the gate electrodes, that is line 16. For this junction breakdown memory cell, a large magnitude threshold voltage, that is programmed, may be interpreted as a stored 1 and a lower magnitude threshold voltage, that is programmed, may be interpreted as a stored 0. For read only memory applications, single common connection to an entire array of memory cells may be satisfactory to provide terminal 26 for the array of gate controlled rectifiers 22. However, for random access memory application, isolated "bulk" lines, which could be achieved using silicon on insulating substrate technology, are required for each column of cells to provide the independent connections 26 which would serve as read-select lines.

While the invention has been described with reference to several particular embodiments thereof, those skilled in the art will recognize that variations in placement of parts may be made within the scope and spirit of the invention.

What is claimed is:

1. A junction memory cell comprising:
    a body of semiconductor of a first conductivity type having a surface;
    a first region of a second conductivity type in said body at said surface forming a PN junction with said body;
    dielectric means on said surface, said dielectric means including a first dielectric layer of a first dielectric material on said surface covering a junction between said body and said first region, said dielectric means also including a second dielectric layer of a second type dielectric material on said first dielectric layer;
    gate electrode means located on said second dielectric layer for controlling a reverse junction current generated by said PN junction responsive to charge representative of a logical 1 or a logical 0 stored in said dielectric means;
    data input means coupled to said gate electrode means for effecting writing said logical 1 or said logical 0 into said dielectric means; and
    sensing output means coupled to said second region for effecting sensing said reverse junction current during reading of said junction memory cell.

2. A junction memory cell as recited in claim 1 wherein said first dielectric layer is silicon dioxide and said second dielectric layer is silicon nitride.

3. A junction memory cell as recited in claim 1 further including a second region of said second conductivity type spaced from said first region, said first dielectric layer covering a junction between said body and said second region, said second dielectric layer being substantially thicker over said junction between said body and said second region and over said space between said first and second regions and over said junction between said first region and said body.

4. The junction memory cell as recited in claim 3 wherein said gate conductor extends over said space on said first dielectric layer.

5. The junction memory cell as recited in claim 1 further including a coupling MOSFET coupled between said first region and a sense conductor.

6. The junction memory cell as recited in claim 5 wherein a gate of said coupling MOSFET is coupled to said gate conductor.

7. A read/write memory storage cell located in a first region of first conductivity type semiconductor comprising:
    a second region of second conductivity type semiconductor located in said first region at a surface thereof;
    a third region of said first conductivity type semiconductor located in said second region at said surface, said second and third regions forming a PN junction at said surface, wherein said PN junction generates a reverse junction current representative of a logical 1 or a logical 0 stored in said read/write memory storage cell when said PN junction is reverse biased;
    a data means for conducting a voltage representative of a logical 1 or a logical 0 to be written into said read/write memory storage cell;
    a sense means coupled to said third region for conducting said reverse junction current during reading of said read/write memory storage cell;
    gate insulator means on said surface covering a portion of said PN junction; and
    gate electrode means located on said gate insulator means and coupled to said data means for controlling said reverse junction current responsive to charge representative of said logical 1 or said logical 0 written into said read/write memory storage cell and stored on said gate electrode means.

* * * * *